United States Patent
Ploss et al.

(10) Patent No.: US 9,245,811 B2
(45) Date of Patent: Jan. 26, 2016

(54) METHOD FOR POSTDOPING A SEMICONDUCTOR WAFER

(71) Applicant: Infineon Technologies AG, Neubiberg (DE)

(72) Inventors: Reinhard Ploss, Unterhaching (DE); Helmut Oefner, Zorneding (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/454,741

(22) Filed: Aug. 8, 2014

(65) Prior Publication Data

US 2015/0050754 A1 Feb. 19, 2015

(30) Foreign Application Priority Data

Aug. 14, 2013 (DE) .......................... 10 2013 216 195

(51) Int. Cl.

| H01L 21/48 | (2006.01) |
| H01L 21/66 | (2006.01) |
| H01L 21/265 | (2006.01) |
| H01L 21/324 | (2006.01) |
| H01L 21/261 | (2006.01) |
| H01L 21/263 | (2006.01) |
| H01L 29/36 | (2006.01) |
| H01L 29/66 | (2006.01) |

(52) U.S. Cl.
CPC .............. *H01L 22/20* (2013.01); *H01L 21/261* (2013.01); *H01L 21/263* (2013.01); *H01L 21/265* (2013.01); *H01L 21/324* (2013.01); *H01L 22/14* (2013.01); *H01L 29/36* (2013.01); *H01L 29/66325* (2013.01)

(58) Field of Classification Search
CPC ... H01L 21/02381; H01L 29/32; H01L 29/66; H01L 29/66128; H01L 29/7432; H01L 29/7395; H01L 29/76243; H01L 31/03682
USPC .................. 438/478–480; 257/E21.331, 336
See application file for complete search history.

(56) References Cited

U.S. PATENT DOCUMENTS

| 4,027,051 A | * | 5/1977 | Reuschel et al. ............... 376/183 |
| 4,129,463 A | * | 12/1978 | Cleland et al. ................. 136/258 |
| 4,135,951 A | * | 1/1979 | Stone ............................ 438/795 |
| 4,348,351 A | * | 9/1982 | Kramer ......................... 376/183 |
| 4,762,802 A | * | 8/1988 | Parrillo ......................... 438/220 |

(Continued)

FOREIGN PATENT DOCUMENTS

| JP | S53135262 A | 11/1978 |
| JP | S59187271 A | 10/1984 |

(Continued)

*Primary Examiner* — Michael Lebentritt
(74) *Attorney, Agent, or Firm* — Eschweiler & Associates, LLC

(57) ABSTRACT

A method for treating a semiconductor wafer having a basic doping is disclosed. The method includes determining a doping concentration of the basic doping, and adapting the basic doping of the semiconductor wafer by postdoping. The postdoping includes at least one of the following methods: a proton implantation and a subsequent thermal process for producing hydrogen induced donors, and a neutron irradiation. In this case, at least one of the following parameters is dependent on the determined doping concentration of the basic doping: an implantation dose of the proton implantation, a temperature of the thermal process, and an irradiation dose of the neutron irradiation.

17 Claims, 6 Drawing Sheets

(56) References Cited

U.S. PATENT DOCUMENTS

| | | | |
|---|---|---|---|
| 4,775,883 A * | 10/1988 | Borchert et al. | 257/168 |
| 5,904,767 A | 5/1999 | Liao | |
| 6,703,292 B1 | 3/2004 | Grover | |
| 7,326,292 B2 | 2/2008 | Kim et al. | |
| 7,667,297 B2 | 2/2010 | Barthelmess et al. | |
| 8,378,384 B2 * | 2/2013 | Schulze et al. | 257/185 |
| 2002/0022348 A1 * | 2/2002 | Sakaguchi et al. | 438/480 |
| 2005/0020033 A1 * | 1/2005 | Specht et al. | 438/478 |
| 2009/0087631 A1 * | 4/2009 | Schulze et al. | 428/213 |
| 2014/0246755 A1 * | 9/2014 | Yoshimura et al. | 257/617 |

FOREIGN PATENT DOCUMENTS

| | | |
|---|---|---|
| JP | S6038815 A | 2/1985 |
| JP | H04132693 A | 5/1992 |
| JP | 2000331950 A | 11/2000 |
| JP | 2002076080 A | 3/2002 |
| JP | 2005012090 A | 1/2005 |
| JP | 2012129308 A | 7/2012 |
| WO | 2004065667 A1 | 8/2004 |
| WO | 2007055352 A1 | 5/2007 |

* cited by examiner

METHOD FOR POSTDOPING A SEMICONDUCTOR WAFER

REFERENCE TO RELATED APPLICATION

This application claims priority to German application number 10 2013 216 195.6 filed on Aug. 14, 2013.

FIELD

Example embodiments of the present disclosure relate to a method for treating a semiconductor wafer, in particular for doping a semiconductor wafer.

BACKGROUND

Semiconductor components having a high dielectric strength, i.e. semiconductor components having dielectric strengths of from a few tens of volts (V) to a few kilovolts (kV), are widely used in many fields, such as, for example, industrial electronics, automotive electronics or consumer electronics. Semiconductor components having a high dielectric strength which are able to carry high currents, such as, for example, currents of a few amperes or more, in the on state are also designated as power components. Semiconductor components having a high dielectric strength include, for example, MOSFETs (Metal Oxide Semiconductor Field-Effect Transistors), IGBTs (Insulated Gate Bipolar Transistors), bipolar transistors, bipolar diodes, thyristors or Schottky diodes.

These components have a relatively lightly doped semiconductor region, usually designated as the drift region (in the case of MOSFETs) or as the base region (in the case of diodes or thyristors). This drift region/base region forms a pn junction or a Schottky junction with another component zone, such as, for example, a body region in the case of a MOSFET or an IGBT, and is able to take up a space charge zone in the case of a reverse-biased pn junction/Schottky junction. The reverse voltage strength, that is to say the voltage which can maximally be applied in the reverse direction before a critical field strength is attained and an avalanche breakdown commences, is dependent, inter alia, on a doping concentration of the drift region/base region and the dimension thereof in a direction perpendicular to the pn junction/Schottky junction.

In a semiconductor component having a high dielectric strength, the drift region/base region occupies a significant part of the volume of a semiconductor body in which the semiconductor component is implemented. This applies in particular to a vertical semiconductor component, that is to say a component in which the drift region/base region is arranged between further component zones (for example the body zone and the drain zone in the case of a MOSFET) situated in the region of opposite sides of the semiconductor body. For the production of such a semiconductor component, therefore, it is desirable to have available a semiconductor substrate having a basic doping that already corresponds to the desired doping of the drift region/base region. Further doped component regions can then be produced by conventional doping methods in the semiconductor substrate, those regions in which the basic doping is maintained forming the drift region/base region.

On account of the abovementioned dependence of the dielectric strength of the component on the doping of the base region/drift region, providing a semiconductor substrate having an exactly defined basic doping is of great importance.

In order to reduce costs when producing semiconductor components, usually a multiplicity of identical components are produced simultaneously on the basis of a semiconductor wafer. Said semiconductor wafer forms a semiconductor substrate for a multiplicity of components and is divided into individual semiconductor chips (referred to as dies) after processing.

Such semiconductor wafers for the production of semiconductor components are obtained by sawing a cylindrical (rod-shaped) single crystal. Known methods for producing such a single crystal include the Czochralski (CZ) method, the magnetic Czochralski (MCZ) method or the float-zone (FZ) method. The single crystal can be doped during the production method. In this case, by means of the FZ method, a single crystal having a very homogeneous and defined doping can be produced, which can be subdivided into semiconductor wafers suitable as substrates for the production of high-voltage components. However, heretofore, single crystals produced according to the FZ method have been available only with a diameter of 8" (inches). In order to increase efficiency, however, it would be desirable to process semiconductor wafers having a higher diameter, such as 12", for example, in order to be able to produce a higher number of components simultaneously.

Heretofore, however, single crystals having such higher diameters have not been able to be produced according to the FZ method. Although such single crystals can be produced by the MCZ method, the single crystal is already doped during the production method, thus resulting in a very inhomogeneous doping which decreases greatly from a first longitudinal end to a second longitudinal end of the semiconductor rod. Furthermore, the maximum doping present at the first longitudinal end can also fluctuate from single crystal to single crystal under identical production conditions.

SUMMARY

In one embodiment of the present disclosure, a semiconductor wafer having a large diameter, such as, for example, 12" or more is provided, for the production of semiconductor components, in particular components having a high dielectric strength.

In one embodiment, the disclosure relates to a method for treating a semiconductor wafer having a basic doping. The method comprises determining a doping concentration of the basic doping, and adapting the basic doping of the semiconductor wafer by postdoping. Said postdoping comprises at least one of the following methods: a proton implantation and a subsequent thermal process for producing hydrogen induced donors; and a neutron irradiation. During the postdoping, at least one of the following parameters is dependent on the determined doping concentration of the basic doping: an implantation dose of the proton implantation, a temperature of the thermal process, and an irradiation dose of the neutron irradiation.

BRIEF DESCRIPTION OF THE DRAWINGS

Example embodiments are explained in greater detail below with reference to drawings. These drawings serve to explain the principle, and so the drawings illustrate only those features which are necessary for understanding the principle. The drawings are not true to scale. In the drawings, unless indicated otherwise, identical reference signs designate identical features having the same meaning.

DETAILED DESCRIPTION

Figure 1:
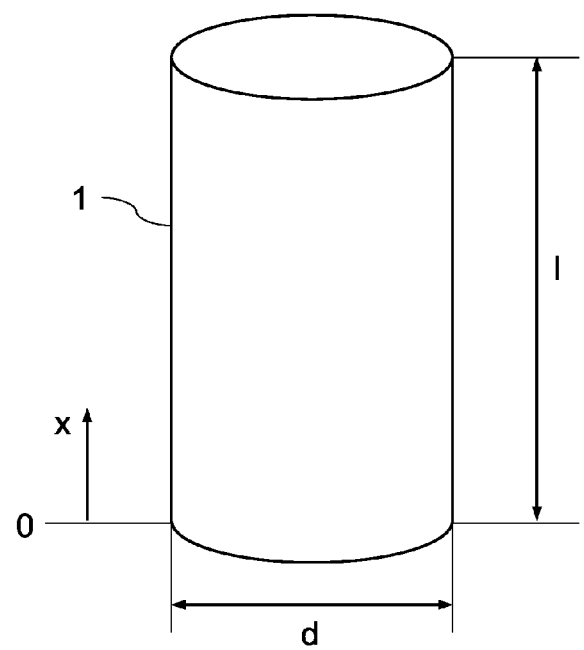
FIG. 1 schematically shows a cylindrical (rod-shaped) single crystal.

FIG. 1 schematically shows a cylindrical monocrystalline semiconductor body 1, which is also designated as a semiconductor rod hereinafter. This semiconductor rod is, for example, a semiconductor rod produced according to the MCZ (magnetic Czochralski) method and has a diameter d and a length l. The diameter d is for example more than 8 inches, such as, for example, 12 inches (approximately 30.48 cm) or more. Such a semiconductor rod 1 can be doped as early as during the production method, i.e. during the pulling of the semiconductor rod from a melt. However, such semiconductor rods that are also doped during the production method have the property that although their doping concentration is approximately homogeneous in a radial direction, i.e. transversely with respect to a longitudinal direction x, the doping concentration varies greatly in the longitudinal direction x of the semiconductor rod.

Figure 2:
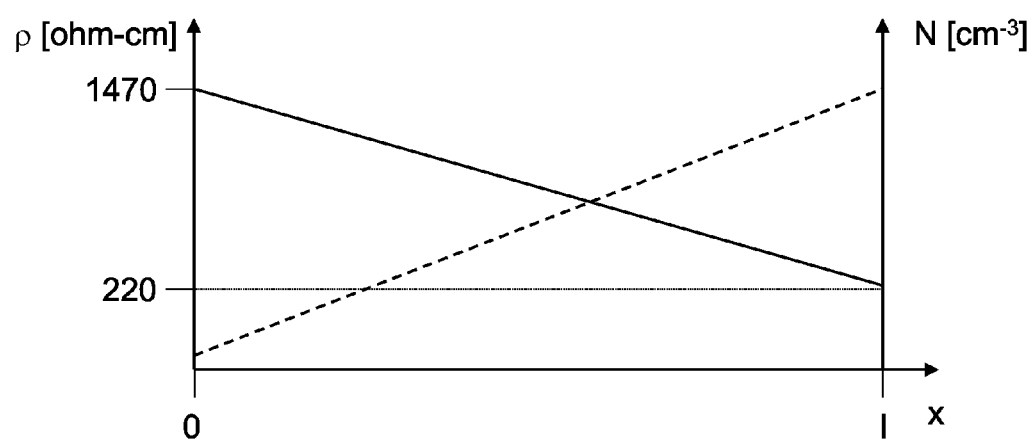
FIG. 2 schematically illustrates the resistivity and the doping concentration of a single crystal produced according to the MCZ method over the length of the single crystal.

FIG. 2 schematically illustrates the resistivity and the doping concentration as a function of a position x of the rod in the longitudinal direction. A length l of the rod 1 is for example 1200 millimeters (mm), the resistivity at one end is for example approximately 1470 ohm-cm, and the resistivity at the opposite end is for example approximately 220 ohm-cm, that is to say is lower by more than a factor of 6.

The resistivity is directly dependent on the doping concentration, the resistivity decreasing if the doping concentration increases. In the example illustrated, it shall be assumed that the semiconductor rod consists of silicon and that it has a basic doping of the n-type produced by n-doping phosphorus atoms as dopant atoms. For the above-indicated values of the resistivity at the two ends, the dopant concentration at said one end is for example approximately $3E12$ cm$^{-3}$, and at the opposite end for example approximately $2E13$ cm$^{-3}$. In a manner corresponding to the electrical resistivity, therefore, the doping concentration over the entire length of the semiconductor rod also varies by more than a factor of 6. Furthermore, from semiconductor rod to semiconductor rod the maximum doping concentration (the minimum resistivity) and accordingly the minimum doping concentration (the maximum resistivity) also vary on account of conventional process fluctuations during the production of the doped semiconductor rods.

From the semiconductor rod illustrated schematically in FIG. 1, semiconductor wafers can be cut off or sawn off in a conventional manner. On account of the above-explained fluctuations of the doping concentration over the length of the semiconductor rod 1, the doping concentrations of the semiconductor wafers produced from such a semiconductor rod fluctuate to a considerable extent, such that semiconductor wafers produced from a semiconductor rod 1 that was doped during the production method, for the reasons explained in the introduction, are primarily not suitable for the production of semiconductor components having a high dielectric strength.

Since semiconductor rods produced according to the MCZ method, and hence the semiconductor wafers produced therefrom, can have a diameter of 12 inches or more, with the use of such semiconductor wafers it is possible to simultaneously produce a higher number of semiconductor components than would be the case, for example, if smaller semiconductor rods produced according to the FZ (float-zone) method were used. Therefore, it is desirable to be able to use semiconductor rods produced according to the MCZ method (or generally semiconductor rods whose doping fluctuates greatly in the longitudinal direction) for the production of semiconductor components having a high dielectric strength.

A description is given below of various methods which ultimately make it possible to use such semiconductor wafers for the production of semiconductor components having a high dielectric strength. These methods require firstly determining a doping concentration of the basic doping of the individual semiconductor wafers. This process of determining the doping concentration of the basic doping can be carried out, for example, by measuring the resistivity of the individual semiconductor wafers. Optical methods for determining the doping concentration, such as, for example, the surface photovoltage method or the μ-PCD (Microwave Photoconductive Decay) method, are also possible.

Figure 3:
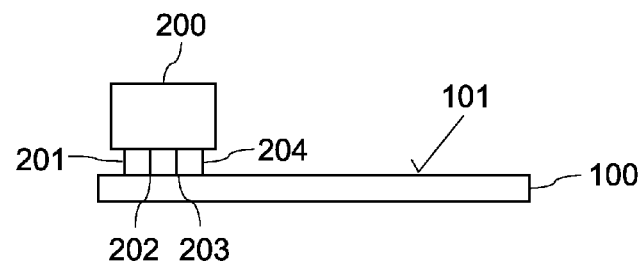
FIG. 3 illustrates one example embodiment of a method for measuring the resistivity of a semiconductor wafer obtained from a cylindrical single crystal.

The electrical resistivity can be measured for example by means of a four-tip measurement on the semiconductor wafer. FIG. 3 schematically shows a side view of such a semiconductor wafer 100 cut off from the semiconductor rod 1. In a four-tip measurement, four electrodes that usually have a contact tip are brought into contact with the surface of the semiconductor wafer 100. This bringing into contact is carried out at one of two main surfaces 101, 102 of the semiconductor wafer 100, which can also be designated as the front and rear sides of the semiconductor wafer 100. FIG. 3 schematically illustrates a measuring arrangement 200 having four contact tips 201, 202, 203, 204. During the measurement, via two of the contact tips, for example the contact tips 201 and 204, a current is impressed into the semiconductor wafer 100 via the surface, and a voltage is determined between the other two contact tips, such as the contact tips 202, 203, for example. On the basis of this measurement, it is possible to determine the electrical resistivity, in particular the electrical surface resistivity of the semiconductor wafer 100. On the basis of the thickness of the semiconductor wafer 100, that is to say the dimension of the semiconductor wafer 100 in a direction perpendicular to the front and rear sides 101, 102, it is then possible to determine the electrical resistivity of the semiconductor wafer 100.

As already mentioned, the electrical resistivity is directly related to the doping concentration of the basic doping, such that the doping concentration of the basic doping can be determined on the basis of the electrical resistivity. For silicon having an n-type basic doping on the basis of phosphorus atoms, the doping concentration of the basic doping can be determined depending on the electrical resistivity for example with the aid of the diagram in Sze: "Semiconductor Devices, Physics and Technology", $2^{nd}$ edition, 2002, Wiley-Verlag, ISBN 0-471-33372-7, page 55, FIG. 7.

As has already been mentioned above, the doping in the semiconductor rod 1 in a radial direction is approximately homogeneous, such that the doping concentration of the basic doping in the semiconductor wafer 100 is approximately homogeneous, on condition that the thickness of the semiconductor wafer 100 is small in comparison with the length l of the semiconductor rod 1. Given a length l of the semiconductor rod 1 of several 100 millimeters, such as, for example, 1000 millimeters or more, and a customary thickness of the semiconductor wafer 100 of less than 1 mm, this condition is met. The above-explained measurement of the surface resistivity, with the aim of determining the doping concentration of the basic doping, can be carried out at a plurality of locations of the front side and/or rear side 101, 102 of the semiconductor wafer 100, wherein the results thereby obtained for the surface resistivity or—derived therefrom—the doping concentration of the basic doping can be averaged. The result obtained by this averaging is then the determined doping concentration of the basic doping of the semiconductor wafer 100.

Figure 4A:
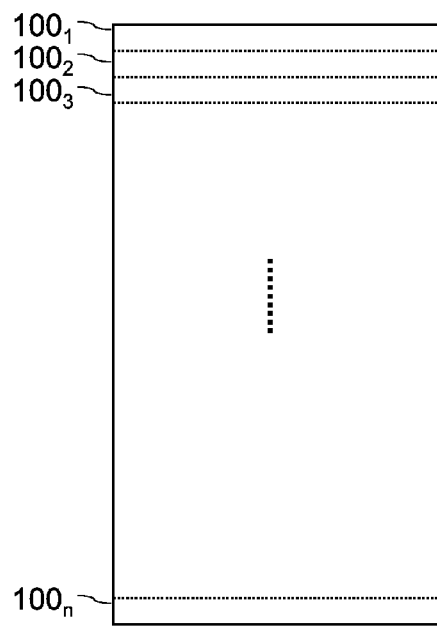
FIGS. 4A and 4B illustrate one example embodiment of a method for measuring the resistivity of a cylindrical single crystal.
Figure 4B:
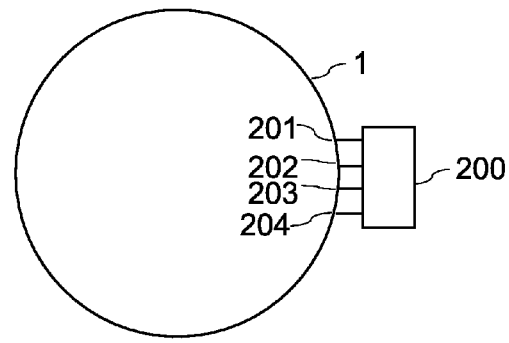

Instead of measuring the resistivity of the semiconductor wafer 100 after the latter has been cut off from the semiconductor rod 1, there is also the possibility of measuring the resistivity of a semiconductor wafer or of a plurality of semiconductor wafers even before they are cut off from the semiconductor rod 1. Such a procedure is illustrated schematically in FIGS. 4A and 4B. FIG. 4A shows a side view of the semiconductor rod 1 during the measurement, and FIG. 4B shows a plan view of the semiconductor rod 1 during the measurement. In this measuring method, provision is made for subdividing the semiconductor rod 1 in the longitudinal direction x into a multiplicity of semiconductor sections (which are still fixedly connected and are part of the monocrystalline rod 1) and for determining at least once the electrical resistivity, and thus the doping concentration of the basic doping, within each of said sections. Afterward, the semiconductor rod 1 is cut up in such a way that each of these individual sections forms a semiconductor wafer 100₁, 100₂, 100₃, 100ₙ, wherein the resistivity previously determined for a semiconductor section or the doping concentration previously determined for said semiconductor section is the determined resistivity or respectively the determined doping concentration of the basic doping of the semiconductor wafer obtained from said semiconductor section.

In the measuring method, provision is made for determining the resistivity of the semiconductor rod 1 at at least one position of the semiconductor rod 1 in the longitudinal direction x, wherein the electrical resistivity determined at this position is the electrical resistivity of the semiconductor wafer that is later cut off from this position of the semiconductor rod 1.

The measurement of the electrical resistivity of the semiconductor rod 1 at one position or at a plurality of positions of the semiconductor rod 1 in the longitudinal direction x thereof can be carried out by means of a four-tip measurement, for example. Referring to FIG. 4B, the measurement in this case takes place for example in such a way that the four contact tips of the measuring device 200 act on the circumferential surface of the semiconductor rod 1 at a distance from one another in a circumferential direction of the semiconductor rod 1. In this method, the surface resistivity is measured, from which the electrical (volume) resistivity can be determined taking account of the geometry of the semiconductor rod.

The method additionally provides for postdoping the semiconductor wafer taking account of the previously determined doping concentration of the basic doping such that the semiconductor wafer 100 has a defined basic doping, i.e. a defined doping concentration of the basic doping. The method provides, in particular, for performing an additional n-type doping of the semiconductor wafer 100. In the case where an n-type basic doping of the semiconductor wafer 100 is present, this additional n-type doping can serve to obtain a higher n-type doping of the semiconductor wafer. In the case where a p-type basic doping of the semiconductor wafer 100 is present, this additional n-type doping can serve to reduce a net p-type doping of the semiconductor wafer.

Figure 5:
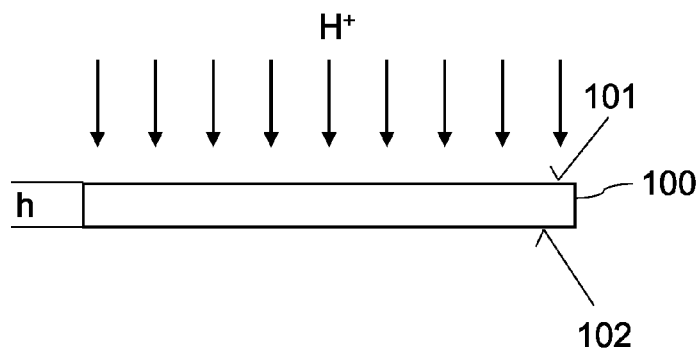
FIG. 5 illustrates one example embodiment of a method for postdoping a semiconductor wafer.

One possible method for postdoping the semiconductor wafer 100 is illustrated schematically in FIG. 5. This method provides for implanting protons (hydrogen ions, $H^+$) into the semiconductor wafer 100 via one of the front and rear sides 101, 102 and subsequently heating the semiconductor wafer, such that the introduced protons in the semiconductor lattice of the semiconductor crystal of the semiconductor wafer 100 form n-doping complexes, so-called hydrogen induced donors. The temperature of this thermal process is for example between 400° C. and 570° C., in particular between 450° C. and 550° C. The duration of the thermal process is for example between one hour and ten hours, in particular between three hours and six hours. The additional doping of the semiconductor wafer 100 that is produced by this postdoping method is an n-type doping, such that this method is suitable for increasing the n-type doping of a semiconductor wafer 100 having a n-type basic doping, or is suitable for reducing the p-type doping of a semiconductor wafer 100 having a p-type basic doping. In the case of a semiconductor wafer 100 having an n-type basic doping, the additional n-type doping produced by the proton irradiation and the thermal process is added to the basic doping already present, such that the following holds true after the conclusion of the method explained with reference to FIG. 5:

$$N_{TOT}=N_G+N_H \tag{1}$$

wherein $N_{TOT}$ is the total doping concentration, $N_G$ denotes the doping concentration of the basic doping, and $N_H$ denotes the doping concentration added by the postdoping.

Since the basic doping $N_G$ can differ greatly for individual semiconductor wafers 100 in the manner explained, it is necessary for the doping concentration $N_H$ added by the postdoping to be adapted to the basic doping $N_G$ already present, in order to achieve a defined total doping of the semiconductor wafer 100.

In the method explained above with reference to FIG. 5, the doping concentration $N_H$ of the added doping can be set by means of two parameters, namely the implantation dose of the protons, that is to say the quantity of protons implanted per unit area via the front side and/or rear side 101, 102 and the temperature of the annealing process. It holds true here that, given a specific implantation dose, the resulting doping concentration is all the lower, the higher the temperature of the annealing process is chosen within the temperature range indicated above. In one example of the method, provision is made for choosing the implantation dose independently of the existing basic doping $N_G$ of the semiconductor wafer 100, i.e. for using the same implantation dose for each semiconductor wafer, and for adapting the temperature of the annealing process depending on the previously determined basic doping $N_G$ in order thereby to set the added doping concentration $N_H$.

The implantation method can be carried out in such a way that protons are implanted into the semiconductor wafer 100 only with one implantation energy via one of the front and rear sides 101, 102 (this side is subsequently designated as the implantation side). A maximum of the proton concentration then initially lies at a position in a vertical direction of the semiconductor wafer 100 which is determined by the implantation energy. This position is usually designated as the end-of-range or end-of-range region of the implantation. The "vertical direction" of the semiconductor wafer 100 is a direction perpendicular to the front and rear sides 101, 102. During the subsequent thermal process, the protons then diffuse in the direction of the side via which the protons were implanted, and hydrogen induced donors arise from crystal defects produced by the proton irradiation in the crystal lattice of the semiconductor wafer 100 and the protons. To what extent the protons diffuse in the direction of the implantation side and how homogeneous a doping is between the end-of-range and the implantation side depends, inter alia, on the duration of the thermal process and the position of the end-of-range proceeding from the implantation side. In principle, it holds true that the doping becomes more homogeneous as the duration of the thermal process increases, i.e. as the duration of the redistribution of the protons increases.

One example provides for carrying out the thermal process until the volume between the implantation side and the end-of-range has an at least approximately homogeneous doping. This should be understood to mean that at least 60% or even at least 80% of a volume of the semiconductor wafer 100 between the implantation side and the end-of-range of the implantation has an at least approximately homogeneous doping. In this connection, an "at least approximately homogeneous doping" is a doping for which a ratio between a maximum doping concentration and a minimum doping concentration in a volume region under consideration is less than 3, less than 2, less than 1.5 or even less than 1.2.

A further method provides for carrying out a plurality of implantations via at least one of the front and rear sides 101, 102 and for varying the implantation energy in the process.

In a region between the end-of-range of the implantation and the opposite side of the semiconductor wafer 100 relative to the implantation side, no crystal defects are produced by the proton implantation, such that no hydrogen induced donors are formed there (despite a possible diffusion of the protons into this region). One example of the method provides for implanting protons into the semiconductor wafer 100 both via the front side 101 and via the rear side 102, wherein the implantation energies can be chosen in particular such that the end-of-range of the implantation via one of the front and rear sides lies closer to the other of the front and rear sides than the end-of-range of the implantation via said other of the front and rear sides. In this case, crystal defects are present in all regions of the semiconductor wafer, such that an approximately homogeneous doping can be achieved over the entire wafer 100.

Another example provides for carrying out implantation only via one side and for removing (thinning) the semiconductor wafer 100, proceeding from the side via which implantation was not effected, as far as the end-of-range or even including the end-of-range. After the removal, the approximately homogeneously doped region remains between the earlier end-of-range and the implantation side. The removal comprises, for example, at least one of an etching method, a grinding method and a polishing method.

Two examples of a postdoping of the semiconductor wafer 100 using a proton implantation and a subsequent thermal process are explained below. For explanation purposes, it shall be assumed that a total basic doping (target doping concentration) of the semiconductor wafer of $3.6E13$ cm$^{-3}$ is intended to be achieved over a depth of at least 120 μm. This basic doping corresponds to a resistivity of 120 ohm-cm. The examples explained below specify in each case the determined basic doping of a semiconductor wafer 100 and the process parameters for the postdoping (proton dose, implantation energy and duration and temperature of the thermal process) which was carried out in order to achieve an at least approximately homogeneous doping with the target doping concentration in the semiconductor wafer 100 between the end-of-range of the implantation and the implantation side.

$1^{st}$ Example

Determined basic doping: $3.08E13$ cm$^{-3}$ (140 ohm-cm)
Implantation energy: 4 MeV
Implantation dose: $1E14$ cm$^{-2}$
Duration of the thermal process: 10 hours
Temperature of the thermal process: 505° C.

$2^{nd}$ Example

Determined basic doping: $2.16E13$ cm$^{-3}$ (200 ohm-cm)
Implantation energy: 4 MeV
Implantation dose: $1.5E14$ cm$^{-2}$
Duration of the thermal process: 8 hours
Temperature of the thermal process: 500° C.

The above-explained postdoping of the semiconductor wafer 100 can be performed on the unprocessed semiconductor wafer 100, that is to say when the semiconductor wafer 100 has only the basic doping with which the semiconductor rod 1 was produced. In this case, however, there is the risk that further process steps carried out for producing components having a high dielectric strength will reduce the doping concentration of the hydrogen induced donors in an undesired manner. In one example embodiment of the method, therefore, provision is made for performing the postdoping of the semiconductor wafer 100 only when some process steps for producing a semiconductor component having a high dielectric strength have already been carried out. This is explained by way of example below with reference to FIGS. 6 to 10.

Figure 6:
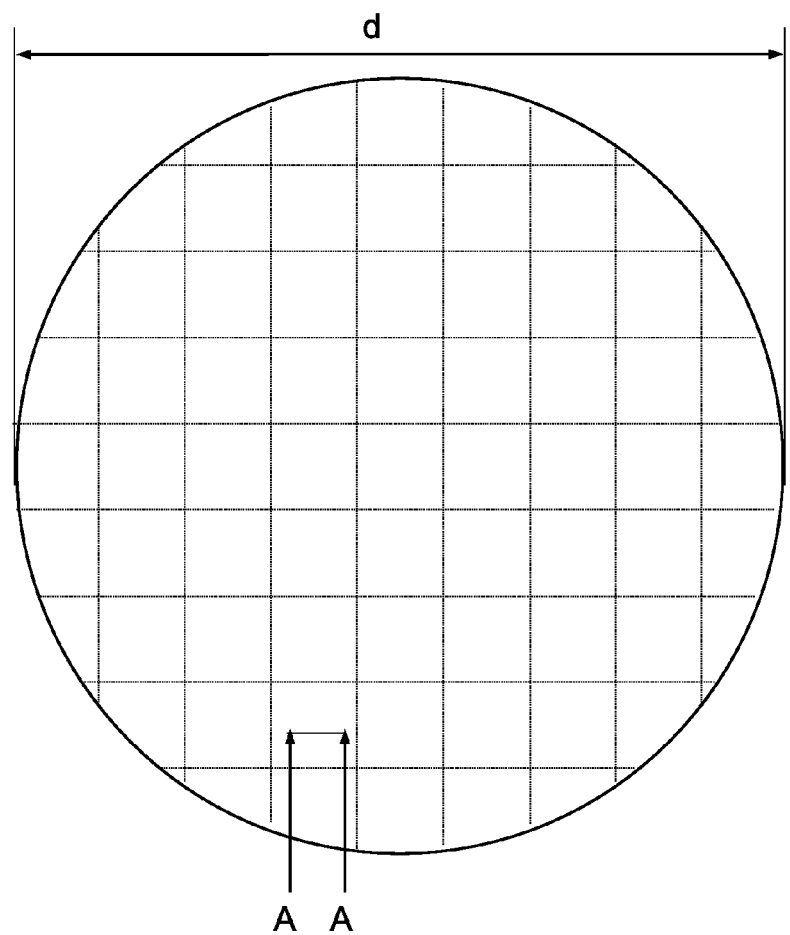
FIG. 6 schematically shows a plan view of a semiconductor wafer and illustrates a grid for later division of the semiconductor wafer.

FIG. 6 schematically shows a plan view of a semiconductor wafer 100 on the basis of which a multiplicity of semiconductor components having a high dielectric strength are produced. Dotted lines illustrate a grid that defines a later subdivision of the semiconductor wafer 100 into individual semiconductor chips. Each of said semiconductor chips is the basis of a semiconductor component having a high dielectric strength, such as, for example, a MOSFET, an IGBT, a diode or a thyristor. The component structures of the individual semiconductor chips are produced simultaneously, wherein, for a given chip size, the yield of semiconductor chips per semiconductor wafer 100, and thus the efficiency of the production method, increases as the diameter d of the semiconductor wafer 100 increases.

FIGS. 7 to 10 illustrate as excerpts a vertical cross section of one of the semiconductor chips in a vertical sectional plane A-A illustrated schematically in FIG. 6. These figures illustrate an excerpt from a so-called inner region of the individual semiconductor chips, that is to say a region in which active component regions of the semiconductor component having a high dielectric strength that is implemented in the semiconductor chip are arranged. So-called edge regions which surround the inner region in a ring-shaped manner and which have an edge termination of the component are not illustrated in these figures.

Figure 7:
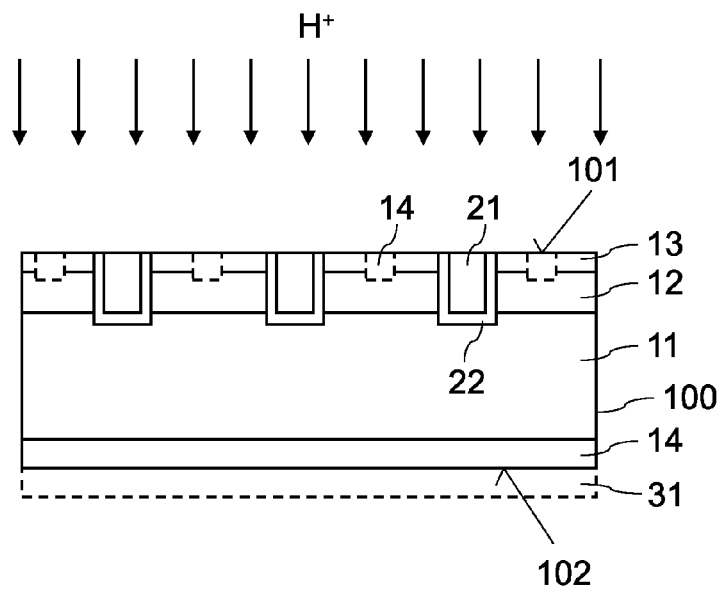
FIG. 7 shows a vertical cross-sectional view of a part of a semiconductor wafer in which component zones of a MOS transistor have already been produced, during the postdoping.

FIG. 7 schematically shows a vertical cross-sectional view of a later MOS transistor during the postdoping. Before the postdoping, i.e. before the proton implantation and the thermal process, in this case a drain region 14 has already been produced in the region of one side 102 (which is designated hereinafter as the rear side), of the wafer 100 and body regions 12, source regions 13 and gate electrodes 21 have already been produced in the region of a further side 101 (which is designated hereinafter as the front side). The gate electrodes 21 are arranged adjacent to the body region 12 and are dielectrically isolated from semiconductor regions in the wafer 100 by a gate dielectric 22. A source region 13, a body region 12 and a gate electrode 21 are in each case part of a so-called transistor cell, wherein the individual transistor cells have a drift region 11, which adjoins the body zones 12 of the individual transistor cells, and the drain region 14 jointly. In the later component, the individual transistor cells are connected in parallel by the gate electrodes 21 being jointly connected to a gate terminal and by the individual source regions being jointly connected to a source terminal. The body regions 12 can have contact regions 14 which extend as far as the front side 101 and via which the body regions 12 can likewise be connected to the source terminal.

The drain region 14 and the source and body regions 13, 12 can be produced in a conventional manner by implantation and/or diffusion processes. The drift region 11 is a region having the basic doping of the semiconductor wafer 100, which before the postdoping is given only by the doping of the semiconductor rod 1. In the example illustrated, the gate electrodes 21 are trench electrodes, that is to say electrodes arranged in trenches of the semiconductor wafer 100. Such gate electrodes 21 can be produced in a conventional manner by producing trenches, producing a gate dielectric 22 on sidewalls and on the bottom of the trenches and by producing gate electrodes 21 on the gate dielectric layer 22. It goes without saying that other gate topologies, such as a planar gate electrode, for example, can also be provided.

During the postdoping, in the manner explained, protons are implanted into the semiconductor wafer 100 via at least one of the front and rear sides 101, 102 and then the thermal process for producing the hydrogen induced donors is carried out. In one example, the proton implantation is carried out via the front side 101 in such a way that the maximum of the proton concentration directly after the implantation, i.e. the end-of-range, is near the drain zone 14 or in the drain zone. In this case, during the thermal process the protons diffuse in the direction of the front side 101 and bring about an approximately homogeneous postdoping of the drift zone 11. During this process, the body zone 12, the source zone 13 and the drain zone 14 can also be postdoped. However, the doping concentrations of these semiconductor zones are usually greater than the desired doping concentration of the postdoping by a multiple, such that the postdoping does not significantly influence the doping concentrations of these semiconductor zones 12, 13, 14. In this regard, the doping concentration of the drain zone 14 and of the source zone 13 lies above $10^{19}$ cm$^{-3}$, for example, and the doping concentration of the body zone 12 lies above $10^{16}$ cm$^{-3}$, for example, while the desired doping concentration of the postdoping lies in the range of between $10^{13}$ cm$^{-3}$ and $10^{14}$ cm$^{-3}$, for example.

The MOS transistor component produced on the basis of the semiconductor wafer 100 in accordance with FIG. 7 can be a MOSFET. In this case, the source zone 13 and the drain zone 14 are n-doped, while the body zone 12 is p-doped. The component can also be embodied as an IGBT, wherein the drain zone 14 is p-doped in this case. In the case of an IGBT, the drain zone 14 is also designated as the emitter zone. Moreover, in the case of an IGBT, emitter short circuits can be present which extend from the rear side 102 through the emitter zone 14 right into the drift zone 11 and which are of the same conduction type as the drift zone 11 (the drift zone 11 is also designated as the base zone in the case of an IGBT). Such emitter short circuits—like the emitter zone 14 as well—can also be produced before the postdoping, but are not illustrated in FIG. 7.

FIG. 7 additionally illustrates a drain metallization (emitter metallization) 31, which is applied to the rear side 102 of the semiconductor body and makes contact with the drain region/emitter region 14. Said metallization 31 can also be produced before the postdoping is carried out, to be precise in particular if the proton implantation is carried out via the front side 101 and if the semiconductor wafer 100 is no longer thinned after the postdoping, as explained below in connection with FIGS. 8A-8B.

A further example embodiment provides for implanting protons via the rear side 102 or protons via the front and rear sides 101, 102. In this case, the metallization 31 is produced after the postdoping has been carried out. The same correspondingly applies to metallizations in the region of the front side 101 which form the later gate terminal and the later source terminal of the component.

Figure 8A:
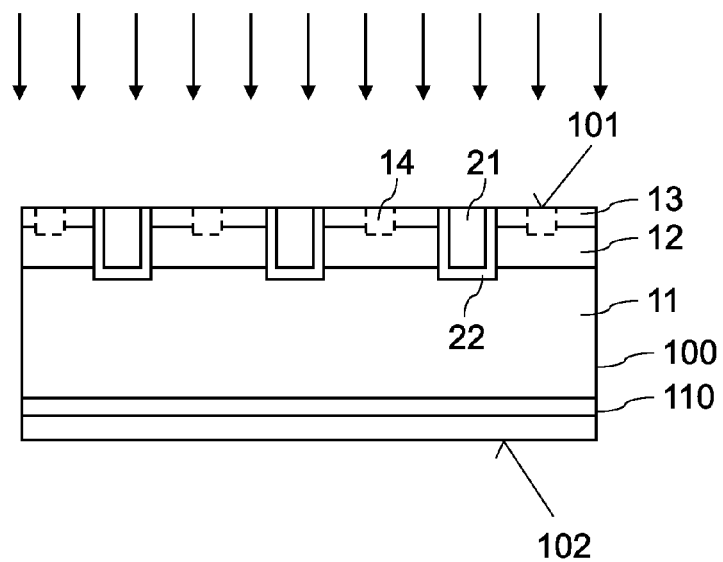
FIGS. 8A and 8B show a vertical cross-sectional view of a part of the semiconductor wafer in which component zones of a MOS transistor have already been produced, during a postdoping in accordance with a further example.
Figure 8B:
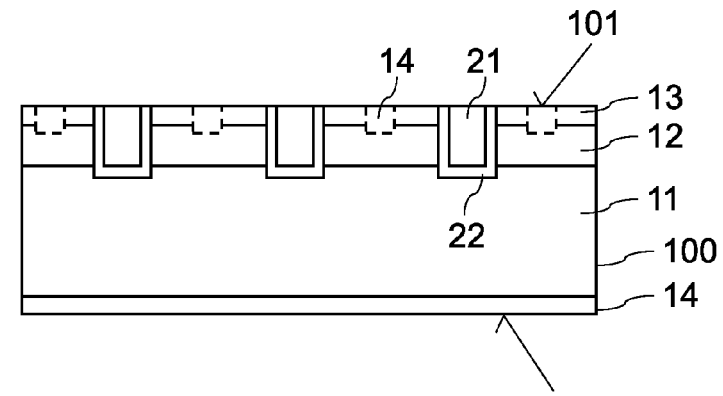

FIGS. 8A and 8B illustrate a further method for a postdoping of a semiconductor wafer 100 during a production of a MOS transistor. These figures in each case show a vertical cross section of an excerpt from the semiconductor wafer 100 during the method.

This method provides for thinning the semiconductor wafer after the postdoping proceeding from the rear side 102. FIG. 8A shows the semiconductor wafer 100 during the proton implantation of the postdoping, wherein, for example, the source and body regions 13, 12 and the gate electrode 21 and the gate dielectric 22 have already been produced beforehand in the region of the front side 101. In the example illustrated, the proton implantation is carried out via the front side 101, and the end-of-range region of the implantation is designated by 110 in FIG. 8A. Between said end-of-range region 110 of the implantation and the rear side 102, hardly any hydrogen induced donors are formed during the thermal process, i.e. the doping is not adapted in this region.

This region between the rear side 102 and the end-of-range region 110 or between the rear side 102 and including the end-of-range region is subsequently removed by the removal of the semiconductor wafer 100 proceeding from the rear side 102. The reference sign 102' in FIG. 8B designates the rear side obtained after this removal. Dopant atoms for producing the drain or emitter zone 14 are subsequently introduced via this rear side 102'. These dopants are implanted, for example. These dopants can be activated by a laser beam or by an RTA (Rapid Thermal Annealing) process. In this case, only a near-surface region of the semiconductor wafer 100 at the rear side 102' is heated briefly, and so this activation has no appreciable influence on the postdoping with hydrogen induced donors. "Near-surface" regions are, for example, those which are nearer than 1 micrometer or nearer than 0.5 micrometer to the surface. The thermal process for producing the hydrogen induced donors can be carried out before or after the activation.

As an alternative to the method explained with reference to FIGS. 7 and 8A-8B, the proton implantation for the postdoping can also be carried out via the rear side 102, for example before the rear-side metallization 31 is applied. In this case, the end-of-range region of the implantation lies in the body regions 12, for example. The drain or emitter region 14 can be produced before or after the proton implantation, wherein, in the last-mentioned case, the semiconductor wafer 100 can also be thinned proceeding from the rear side 102 before the production of the drain or emitter region 14.

Figure 9:
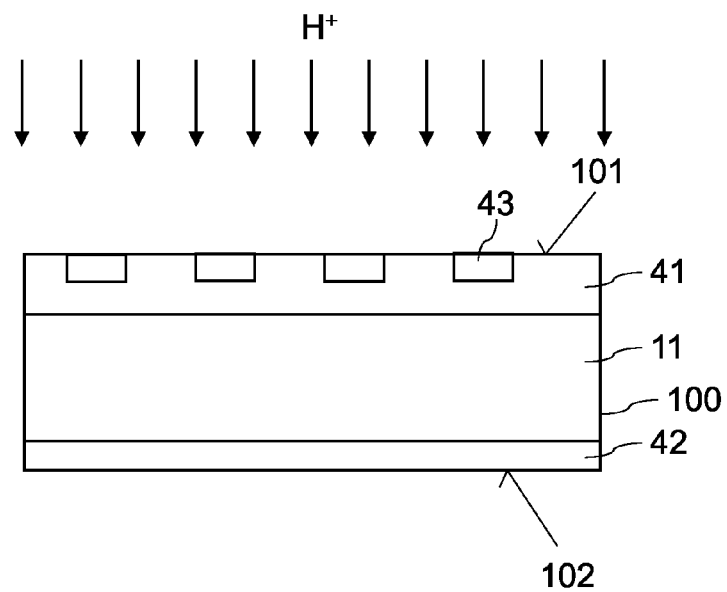
FIG. 9 shows a vertical cross-sectional view of a part of a semiconductor wafer in which component zones of a thyristor have already been produced, during the postdoping.

FIG. 9 schematically shows a vertical cross-sectional view of a portion of the semiconductor wafer 100 in which active component regions of a thyristor were produced before the postdoping. The active component regions are a p-type emitter 42 in the region of the rear side 102 of the semiconductor wafer 100, a p-type base 41 in the region of the front side 101, and n-type emitters 43 arranged in the p-type base 41. The p-type emitter 42, the p-type base 41 and the n-type emitters 43 can be produced in a conventional manner by implantation and/or diffusion processes. Arranged between the p-type emitter 42 and the p-type base 41 there is an n-type base 11, which has a doping which corresponds to the basic doping of the semiconductor wafer 100 and the doping of which is adapted by the postdoping. The doping concentrations of the p-type base 42, of the n-type emitters 43 and of the p-type emitter 42 can also be altered by the postdoping, but the doping concentrations of these component regions are significantly higher than the doping concentration provided by the postdoping, and so no significant change in the doping concentrations of these semiconductor regions 41-43 occurs.

As also in the case of the example embodiment explained above with reference to FIG. 7, the protons can be implanted into the semiconductor wafer 100 via the front side 101, the rear side 102 or via the front and rear sides 101, 102. If protons are implanted only via one of the front and rear sides 101, 102 and if no thinning proceeding from the rear side is carried out, a metallization can already been applied to the other of said front and rear sides 101, 102 before the postdoping is carried out. The p-type emitter 43 can—in a manner corresponding to the drain or emitter region in accordance with FIGS. 7 and 8A-8B—be produced before or after the postdoping.

The doping concentration of the p-type emitter 42 and of the n-type emitters 43 is for example in the range of the doping concentration of the source and drain regions 13, 14 of the component in accordance with FIG. 7, and the doping concentration of the p-type base 41 is for example in the range of the doping concentration of the body zone 12 in accordance with FIG. 7.

Figure 10:
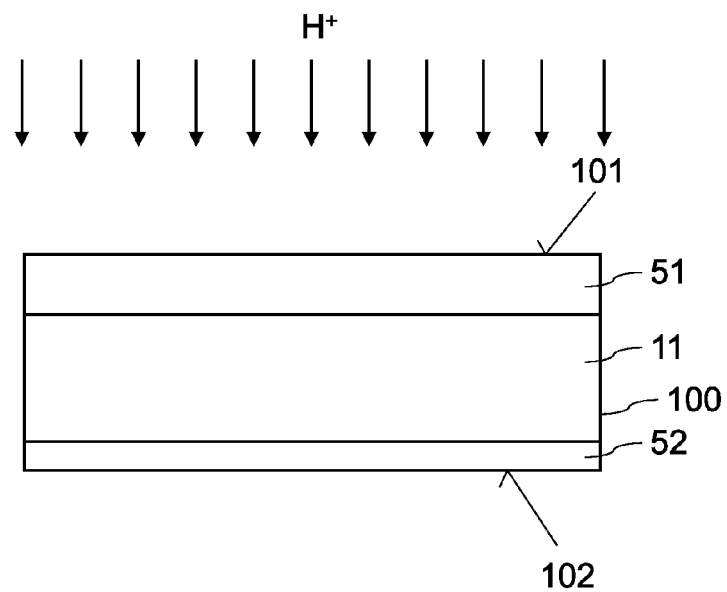
FIG. 10 shows a vertical cross-sectional view of a part of a semiconductor wafer in which component zones of a bipolar transistor have already been produced, during the postdoping.

FIG. 10 shows a component structure of a bipolar diode during the postdoping. This bipolar diode comprises an n-type base 11, the doping of which corresponds to the basic doping of the semiconductor wafer 100, and a first emitter 51, for example an n-type emitter 51, in the region of the front side 101 of the semiconductor wafer and a second emitter 52, such as, for example, a p-type emitter, in the region of the rear side 102 of the semiconductor wafer 100. These two emitters 51, 52 can be produced in a conventional manner by implantation and/or diffusion processes. By means of the postdoping with the proton implantation and the thermal process, the doping concentration of the n-type base 11 is postdoped. In this case, the two emitters 51, 52 can also be postdoped. However, the doping concentration thereof is significantly higher than the doping concentration produced by the postdoping, and so no significant change in the doping concentrations of the two emitters 51, 52 occurs as a result of the postdoping. In this regard, the doping concentration of the two emitters 51, 52 is more than $10^{19}$ cm$^{-3}$, for example, while the doping concentration of the postdoping is only between $10^{13}$ cm$^{-3}$ and $10^{14}$ cm$^{-3}$, for example. The proton implantation, as also in the case of the methods explained above with reference to FIGS. 7 and 8, can be carried out only via one of the front and rear sides 101, 102 or via both of said front and rear sides 101, 102. If a proton implantation is carried out only via one of these two sides, a metallization 31 can already be produced on the other of these two sides, such as the rear side 102, for example, before the postdoping is carried out, provided that the semiconductor wafer 100 is no longer thinned. The rear-side emitter 52 can—in a manner corresponding to the drain or emitter region in accordance with FIGS. 7 and 8A-8B—be produced before or after the postdoping.

Figure 11:
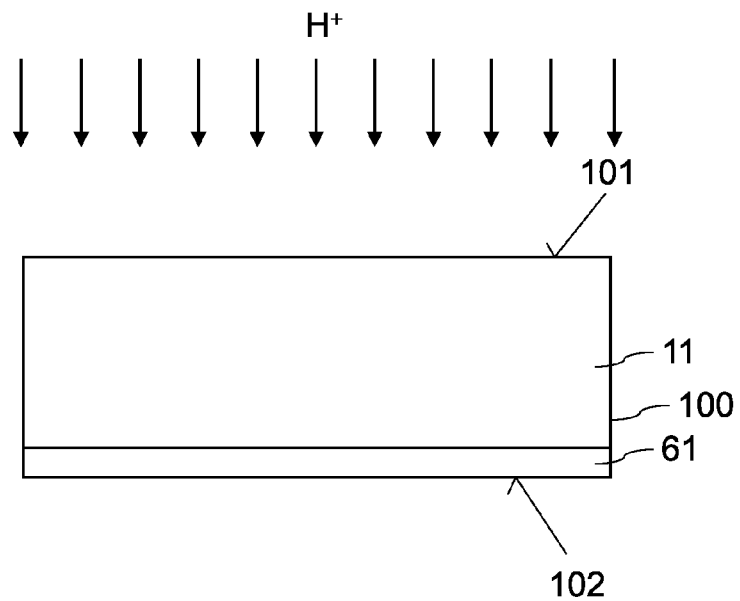
FIG. 11 shows a vertical cross-sectional view of a part of a semiconductor wafer in which component zones of a Schottky diode have already been produced, during the postdoping.

FIG. 11 shows a vertical cross-sectional view of a later Schottky diode during the postdoping. In this case, the semiconductor wafer 100 has an n-type emitter 61 in the region of the rear side 102 which adjoins the n-type base 11. The n-type base 11 has a doping which corresponds to the basic doping of the semiconductor wafer 100 and the doping of which is adapted by the postdoping. In later method steps, a Schottky metal is then applied on the front side 101 of the semiconductor wafer 100. The rear-side emitter 61 can—in a manner corresponding to the drain or emitter region in accordance with FIGS. 7 and 8A-8B—be produced before or after the postdoping.

In the method explained, the total doping concentration of the semiconductor wafer is composed of the original doping concentration resulting from the process for producing the semiconductor wafer 100 or the semiconductor rod 1 and the doping concentration added by the postdoping. One example of the method provides for the original basic doping concentration already to make up at least 20%, at least 40% or at least 60% of the total doping concentration. Correspondingly, the postdoping contributes a maximum of 80%, a maximum of 60% or a maximum of 40% to the total doping concentration after the postdoping has been carried out. The presence of a basic doping of the order of magnitude mentioned above has the result that parasitic effects, such as, for example, the presence of oxygen in the semiconductor wafer, have a less disturbing effect than in a comparative case in which, proceeding from an intrinsic semiconductor wafer, the doping is brought about only by hydrogen induced donors. Moreover, the costs of the postdoping are lower than in a method in which, proceeding from an intrinsic semiconductor wafer, the doping is brought about only by hydrogen induced donors, since the required proton implantation dose is significantly lower than for the case of a pure proton doping.

As an alternative or in addition to a postdoping comprising a proton implantation and a thermal process, a postdoping of the semiconductor wafer 100 can also be effected by means of a neutron irradiation. During the irradiation of a semiconductor wafer 100 consisting of silicon with neutrons, radioactive silicon-31 (31Si) arises, which decays to n-doping phosphorus with a half-life of approximately 2.6 hours and with emission of beta radiation. In this method, the doping concentration of the postdoping can be set by means of the irradiation dose of the neutrons. For the total doping after carrying out such a postdoping method using a neutron irradiation, the following holds true:

$$N_{TOT}=N_G+N_N \quad (2),$$

wherein $N_{TOT}$ is the total basic doping after the postdoping has been carried out, $N_G$ is the basic doping before the postdoping and $N_N$ is the postdoping brought about by the neutron implantation.

Figure 12:
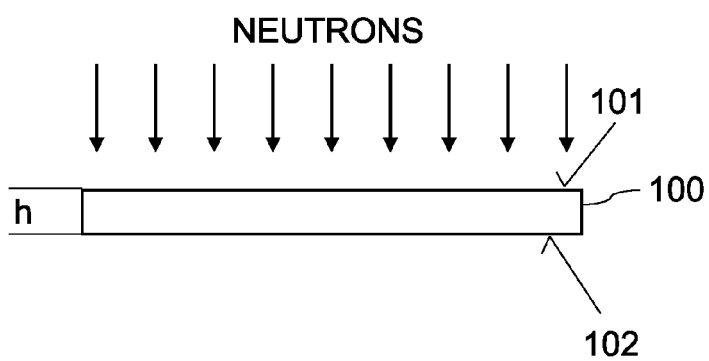
FIG. 12 illustrates one example embodiment of a further method for postdoping a semiconductor wafer.

Referring to FIG. 12, which schematically shows a vertical cross section through the semiconductor wafer 100, the neutrons can be implanted into the semiconductor wafer 100 via the front side 101 and/or the rear side 102. The neutron irradiation takes place in a nuclear reactor, for example.

Figure 13:
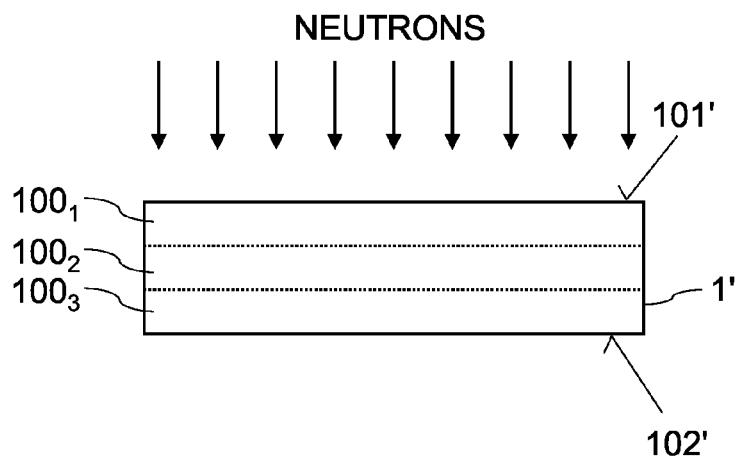
FIG. 13 illustrates one example embodiment of yet another method for postdoping a semiconductor wafer.

Since neutrons penetrate far into the semiconductor wafer even with a comparatively low implantation energy, there is also the possibility of carrying out the postdoping for a plurality of semiconductor wafers simultaneously, which jointly form a monocrystalline portion of the original semiconductor rod 1. FIG. 13 schematically shows a vertical cross section through such a portion of the original semiconductor rod 1. This portion of the semiconductor rod 1 comprises a plurality of subportions that respectively form a later semiconductor wafer 100₁, 100₂, 100₃. These are three semiconductor wafers in the case of the exemplary embodiment illustrated in FIG. 13. However, this is only an example; provision can also be made of more than three subportions that respectively later form a semiconductor wafer. The neutron irradiation can be carried out via a front side 101' and/or a rear side 102' of the rod portion 100'. Alternatively or supplementarily, the neutron irradiation can also be carried out via the side wall for the case of the doping of a rod portion.

Since a thermally stable n-type doping results from the neutron implantation, the postdoping using the neutron implantation can already be carried out on the end process semiconductor wafer 100, i.e. before implantation and/or diffusion processes for producing active component regions are actually carried out. Optionally, a specific heat treatment step for activating the phosphorus doping and for annealing the radiation damage can be carried out, wherein the temperatures can be between 800° C. and 1000° C. and the duration is one or more hours, for example. However, it is also possible to use for this purpose temperature steps which are carried out during the production of a semiconductor component for other purposes, such as, for example, for activating or indiffusing implanted dopants.

The method explained above makes it possible to individually adapt the doping concentration of a semiconductor wafer which already has a basic doping.

In the method, there is the possibility, in particular, of setting different total dopings for different semiconductor wafers from a semiconductor rod, depending on the requirement. In this regard, by way of example, semiconductor wafers having a low basic doping can be postdoped such that they have a first total doping concentration, while semiconductor wafers which already have a higher basic doping can be postdoped such that they have a second total doping concentration, higher than the first total doping concentration. The individual wafers from a rod can be grouped, for example, wherein the dopings of the wafers of the different groups are adapted to different total doping concentrations, for example.

The invention claimed is:

1. A method for treating a semiconductor wafer having a basic doping, wherein the method comprises:
determining a doping concentration of the basic doping; and
adapting the basic doping of the semiconductor wafer by postdoping comprising
a proton implantation and a subsequent thermal process for producing hydrogen induced donors,
wherein at least one of the following parameters is dependent on the determined doping concentration of the basic doping:
an implantation dose of the proton implantation, and
a temperature of the thermal process,
wherein the semiconductor wafer has a first side,
wherein the proton implantation is carried out via the first side, and
wherein the proton implantation comprises at least two proton implantation acts in which protons are implanted with different implantation energies.

2. The method as claimed in claim 1, wherein the temperature during the thermal process is between 400° C. and 570° C. or between 450° C. and 550° C.

3. The method as claimed in claim 2, wherein the duration of the thermal process is between one hour and ten hours or between three hours and six hours.

4. The method as claimed in claim 1, wherein determining the doping concentration of the basic doping of the semiconductor wafer comprises a measurement of a resistivity of the semiconductor wafer.

5. The method as claimed in claim 4,
wherein the semiconductor wafer is a semiconductor wafer obtained by dividing a cylindrical single crystal, and
wherein the resistivity is measured after the single crystal has been divided.

6. The method as claimed in claim 4,
wherein the semiconductor wafer is a semiconductor wafer obtained by dividing a cylindrical single crystal, and
wherein the resistivity is measured before the single crystal is divided.

7. The method as claimed in claim 1, wherein the basic doping is an n-type basic doping.

8. The method as claimed in claim 7, wherein the basic doping is formed by phosphorus atoms.

9. The method as claimed in claim 1, wherein the basic doping is a p-type basic doping.

10. The method as claimed in claim 5, wherein the doping concentration of the basic doping is higher than $1E13\ cm^{-3}$.

11. The method as claimed in claim 10, wherein the doping concentration of the basic doping is higher than $1E12\ cm^{-3}$.

12. The method as claimed in claim 1, wherein a doping concentration of the basic doping before the adaptation is between 20% to 60% of a doping concentration after the adaptation.

13. A method for treating a semiconductor wafer having a basic doping, wherein the method comprises:
determining a doping concentration of the basic doping; and
adapting the basic doping of the semiconductor wafer by postdoping comprising a proton implantation and a subsequent thermal process for producing hydrogen induced donors,
wherein at least one of an implantation dose of the proton implantation and a temperature of the thermal process is dependent on the determined doping concentration of the basic doping,
wherein protons are implanted during the proton implantation via a first side of the semiconductor wafer into an end-of-range region of the semiconductor wafer, and
wherein the thermal process is chosen such that a doping concentration added by the adaptation is approximately homogeneous in at least between 60% to at least 80% of a volume of the semiconductor wafer in a region between the end-of-range region and the first side.

14. The method as claimed in claim 11, wherein a ratio between a maximum doping concentration and a minimum doping concentration in the at least approximately homogeneously doped volume is less than 1.2.

15. A method for treating a semiconductor wafer having a basic doping, wherein the method comprises:
determining a doping concentration of the basic doping; and
adapting the basic doping of the semiconductor wafer by postdoping comprising a proton implantation and a subsequent thermal process for producing hydrogen induced donors,
wherein at least one of an implantation dose of the proton implantation and a temperature of the thermal process is dependent on the determined doping concentration of the basic doping, wherein protons are implanted during the proton implantation via a first side of the semiconductor wafer into an end-of-range region, and wherein the semiconductor wafer is removed at least as far as the end-of-range region proceeding from a second side situated opposite the first side.

16. The method as claimed in claim 1, wherein the semiconductor wafer is a semiconductor wafer produced according to the magnetic Czochralski (MCZ) method.

17. The method as claimed in claim 1, wherein the semiconductor wafer has a diameter of 12 inches or more.

* * * * *